US012011739B2

(12) United States Patent
Chiba et al.

(10) Patent No.: US 12,011,739 B2
(45) Date of Patent: Jun. 18, 2024

(54) DIELECTRIC ELASTOMER VIBRATION SYSTEM AND POWER SUPPLY DEVICE

(71) Applicants: Seiki Chiba, Tokyo (JP); Mikio Waki, Sakura (JP); ZEON CORPORATION, Tokyo (JP)

(72) Inventors: Seiki Chiba, Tokyo (JP); Mikio Waki, Sakura (JP); Mitsuaki Ito, Ageo (JP); Makoto Sawada, Ageo (JP)

(73) Assignees: Seiki Chiba, Tokyo (JP); Mikio Waki, Sakura (JP); ZEON CORPORATION, Tokyo (JP)

( * ) Notice: Subject to any disclaimer, the term of this patent is extended or adjusted under 35 U.S.C. 154(b) by 663 days.

(21) Appl. No.: 17/278,787

(22) PCT Filed: Sep. 26, 2019

(86) PCT No.: PCT/JP2019/037785
§ 371 (c)(1),
(2) Date: Mar. 23, 2021

(87) PCT Pub. No.: WO2020/067252
PCT Pub. Date: Apr. 2, 2020

(65) Prior Publication Data
US 2022/0040734 A1 Feb. 10, 2022

(30) Foreign Application Priority Data
Sep. 27, 2018 (JP) ................. 2018-181924

(51) Int. Cl.
*B06B 1/02* (2006.01)
*H04R 1/02* (2006.01)
(Continued)

(52) U.S. Cl.
CPC ....... *B06B 1/0269* (2013.01); *H10N 30/2047* (2023.02); *H10N 30/857* (2023.02);
(Continued)

(58) Field of Classification Search
CPC ............ H10N 30/2047; H10N 30/871; H10N 30/877; H10N 30/857; B06B 1/0269; H04R 1/02; H04R 3/00
See application file for complete search history.

(56) References Cited

U.S. PATENT DOCUMENTS 7,990,022 B2 *   8/2011   Heim ............... H02N 2/046
                                                        310/800
2010/0103226 A1 * 4/2010   Sakashita .......... C04B 35/457
                                                        423/508
(Continued)

FOREIGN PATENT DOCUMENTS

JP   2002176788 A   6/2002
JP   2008195603 A   8/2008
(Continued)

OTHER PUBLICATIONS

May 17, 2022, the Extended European Search Report issued by the European Patent Office in the corresponding European Patent Application No. 19867928.4.
(Continued)

*Primary Examiner* — J. San Martin
(74) *Attorney, Agent, or Firm* — KENJA IP LAW PC

(57) ABSTRACT

A dielectric elastomer vibration system includes a dielectric elastomer vibrator with a dielectric elastomer layer and a pair of electrode layers, and a power supply device producing a potential difference across the electrode layers. The vibrator exhibits various modes or regions of relationship between potential difference and deformation induced by the potential difference: a high-response region in which a relatively large deformation is induced; a low-response region of lower-potential difference in which a relatively small deformation is induced; and a low-response region of higher-potential difference in which a relatively small deformation is induced or in which a break point of the dielectric
(Continued)

elastomer layer is included. The power supply device produces the potential difference by applying across the electrode layers a vibration signal voltage, which is generated by combining an AC voltage with a bias DC voltage corresponding to a potential difference falling in the high-response region.

21 Claims, 13 Drawing Sheets

(51) Int. Cl.
  *H04R 3/00* (2006.01)
  *H10N 30/20* (2023.01)
  *H10N 30/857* (2023.01)
  *H10N 30/87* (2023.01)

(52) U.S. Cl.
  CPC ......... *H10N 30/871* (2023.02); *H10N 30/877* (2023.02); *B06B 2201/57* (2013.01); *H04R 1/02* (2013.01); *H04R 3/00* (2013.01)

(56) References Cited

U.S. PATENT DOCUMENTS

| | | | |
|---|---|---|---|
| 2014/0333992 A1* | 11/2014 | Wagemans | G02B 26/0875 |
| | | | 29/25.35 |
| 2016/0352254 A1 | 12/2016 | Orita | |
| 2017/0254383 A1 | 9/2017 | Orita | |
| 2021/0297013 A1* | 9/2021 | Chiba | H02N 2/181 |
| 2022/0149264 A1* | 5/2022 | Pelssers | H10N 30/2042 |

FOREIGN PATENT DOCUMENTS

| | | |
|---|---|---|
| JP | 2014236565 A | 12/2014 |
| JP | 2016046953 A | 4/2016 |

OTHER PUBLICATIONS

Dec. 17, 2019, International Search Report issued in the International Patent Application No. PCT/JP2019/037785.

\* cited by examiner (a) Vibration Signal Voltage Va (b) Vibration Signal Voltage Vb

DIELECTRIC ELASTOMER VIBRATION SYSTEM AND POWER SUPPLY DEVICE

TECHNICAL FIELD

The present disclosure relates to dielectric elastomer vibration systems that can be used as speakers, for example, and also relates to power supply devices used in such systems.

BACKGROUND ART

A dielectric elastomer transducer includes a dielectric elastomer layer sandwiched between a pair of electrode layers and has a variety of applications, such as actuation, power generation and sensing. As one implementation of a dielectric elastomer transducer as an actuator, Patent Document 1 discloses a vibrator of a speaker, for example.

A dielectric elastomer vibrator, which is a dielectric elastomer transducer used as a vibrator, operates in response to a vibration signal voltage having a waveform representing sound, which is a form of vibrations. When the vibration signal voltage is applied, a potential difference is produced across the pair of electrode layers, causing the dielectric elastomer transducer to reproduce the sound.

PRIOR ART DOCUMENT

Patent Document

Patent Document 1: JP-A-2016-46953

SUMMARY OF THE INVENTION

Problem to be Solved by the Invention

Generally, the user perceives sound by hearing. It is therefore important that the dielectric elastomer vibrator deforms in a linear relationship with the change of the potential difference across the electrode layers caused by the input of a vibration signal voltage. Otherwise, the resulting sound may be perceived as degraded with distortion, for example.

The present disclosure has been conceived in view of the problems noted above and aims to provide a dielectric elastomer vibration system and a power supply device configured to generate proper vibrations.

Means to Solve the Problem

A first aspect of the present disclosure provides a dielectric elastomer vibration system comprising: a dielectric elastomer vibrator that includes a dielectric elastomer layer and a pair of electrode layers sandwiching the dielectric elastomer layer; and a power supply device that produces a potential difference across the pair of electrode layers. The dielectric elastomer vibrator exhibits a relationship between the potential difference across the pair of electrode layers and an amount of deformation induced by the potential difference, where the relationship has: a high-response region in which a relatively large deformation is induced in response to change of the potential difference; a low-response region of lower-potential difference corresponding to a lower potential difference than the high-response region and in which a relatively small deformation is induced in response to change of the potential difference; and a low-response region of higher-potential difference corresponding to a higher potential difference than the high-response region and in which a relatively small deformation is induced in response to change of the potential difference or in which a break point of the dielectric elastomer layer is included. The power supply device produces the potential difference by applying a vibration signal voltage across the pair of electrode layers, where the vibration signal voltage is generated by combining an alternating waveform voltage with a direct current bias voltage corresponding to a potential difference falling in the high-response region.

A second aspect of the present disclosure provides a power supply device for producing a potential difference across a pair of electrode layers sandwiching a dielectric elastomer layer included in a dielectric elastomer vibrator. The dielectric elastomer vibrator exhibits a relationship between the potential difference across the pair of electrode layers and an amount of deformation induced by the potential difference, where the relationship has: a high-response region in which a relatively large deformation is induced in response to change of the potential difference; a low-response region of lower-potential difference corresponding to a lower potential difference than the high-response region and in which a relatively small deformation is induced in response to change of the potential difference; and a low-response region of higher-potential difference corresponding to a higher potential difference than the high-response region and in which a relatively small deformation is induced in response to change of the potential difference or in which a break point of the dielectric elastomer layer is included. The power supply device is configured to produce the potential difference by applying a vibration signal voltage across the pair of electrode layers, the vibration signal voltage being generated by combining a waveform voltage comprising an alternating current voltage with a bias voltage that is a direct current voltage corresponding to a potential difference falling in the high-response region.

Advantages of Invention

The present disclosure can ensure the vibrations to be produced more appropriately.

Other features and advantages of the present invention will be more apparent from detailed description given below with reference to the accompanying drawings.

MODE FOR CARRYING OUT THE INVENTION

Preferred embodiments of the present disclosure are described below with reference to the accompanying drawings.

The present disclosure provides a dielectric elastomer vibration system. In the system, a power supply device outputs a vibration signal voltage based on an input signal associated with vibrations, and a dielectric elastomer vibrator vibrates in response to the vibration signal voltage. The source vibrations of the input signal are not specifically limited, and various types of vibrations can be used. The following embodiments are directed to examples in which sound is used as vibrations.

First Embodiment

Figure 1:
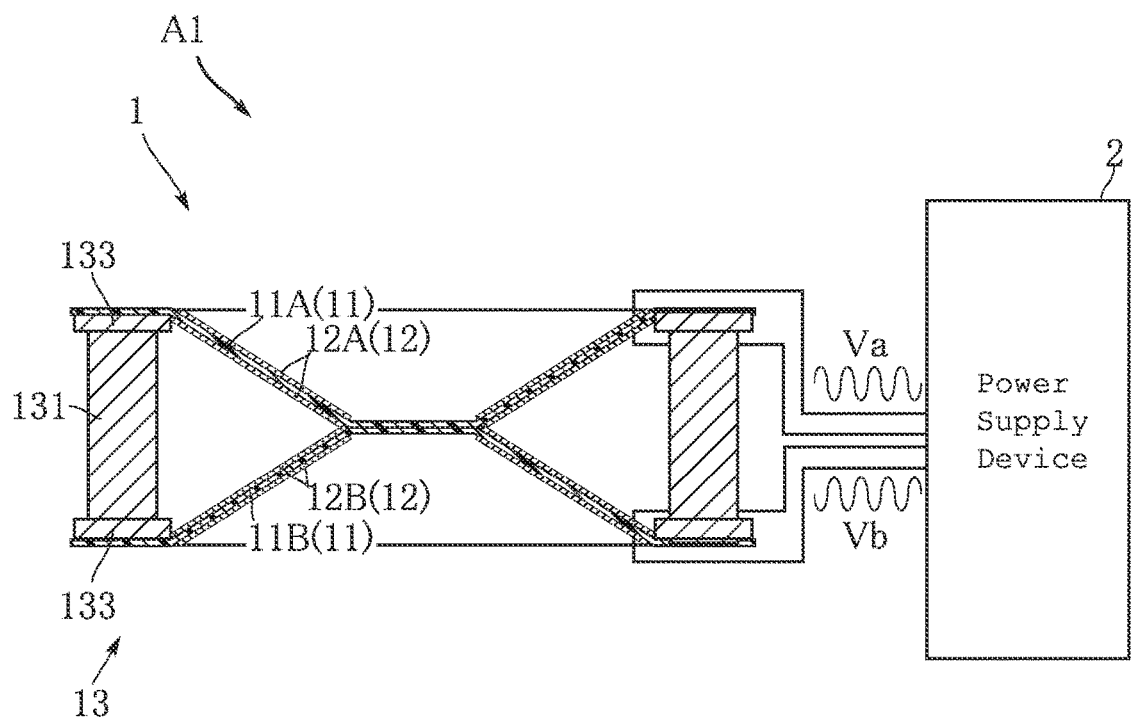
FIG. 1 is a view showing a configuration of a dielectric elastomer vibration system according to a first embodiment of the present disclosure.
Figure 2:
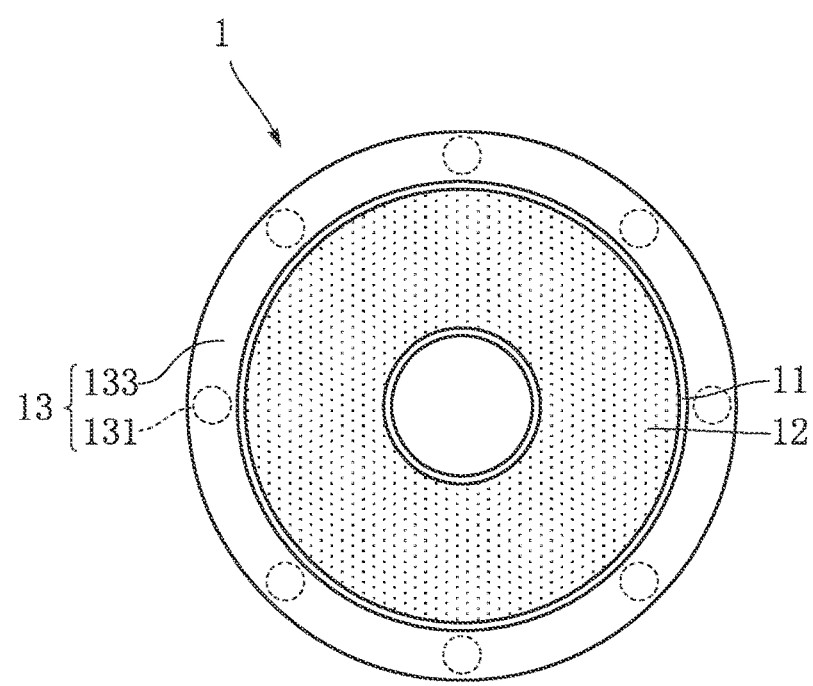
FIG. 2 is a plan view showing a dielectric elastomer vibrator of the dielectric elastomer vibration system according to the first embodiment of the present disclosure.
Figure 3:
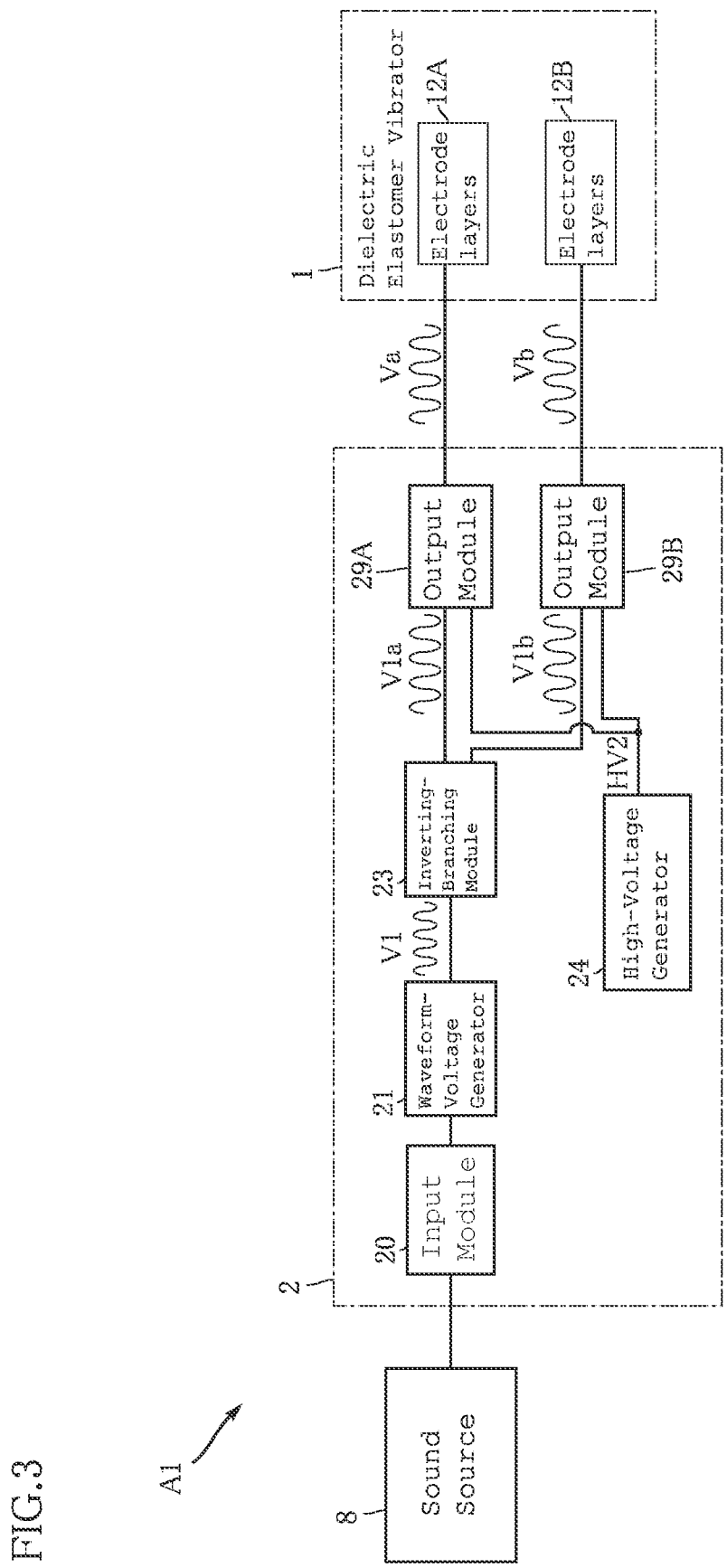
FIG. 3 is a block diagram of the dielectric elastomer vibration system according to the first embodiment of the present disclosure.

FIGS. 1 to 3 show a dielectric elastomer vibration system according to a first embodiment of the present disclosure. The dielectric elastomer vibration system A1 of the present embodiment includes a dielectric elastomer vibrator 1 and a power supply device 2. The dielectric elastomer vibration system A1 receives a sound signal from the sound source 8 and outputs sound by, for example, amplifying the sound signal. Typically, the dielectric elastomer vibration system A1 outputs sounds in a range of 20 to kHz, which is the frequency range of human hearing. This frequency range, however, is cited merely by way of example and without limitation.

The dielectric elastomer vibrator 1 includes dielectric elastomer layers 11, electrode layers 12 and a support 13. In the present embodiment, the dielectric elastomer vibrator 1 includes two dielectric elastomer layers 11A and 11B and two pairs of electrode layers 12A and 12B. In a different embodiment, however, only one dielectric elastomer layer 11 and one pair of electrode layers 12 may be included. In such an embodiment, it is preferable to provide an elastic member (not shown) for stretching the dielectric elastomer layer 11 when there is no potential difference across the pair of electrode layers 12.

The dielectric elastomer layers 11 need to be elastically stretchable and have a high dielectric strength. Suitable materials for the dielectric elastomer layers 11 include, but not limited to, silicone elastomers and acrylic elastomers.

Each electrode layer 12 is formed on a surface of a dielectric elastomer layer 11 and receives voltage from the power supply device 2. In the dielectric elastomer vibrator 1, each pair of electrode layers 12 sandwich a corresponding dielectric elastomer layer 11. The electrode layers 12 are made of an electrically conductive material that is stretchable to comply with extension and contraction of the dielectric elastomer layers 11. Examples of such a material include a stretchable base material incorporating conductive fillers. Preferable examples of fillers include carbon nanotubes.

The support 13 supports the dielectric elastomer layers 11A and 11B. In the present embodiment, the support 13 includes two circumferential portions 133 and a plurality of pillar portions 131. The two circumferential portions 133 are ring-shaped members, for example, and spaced apart from each other in the vertical direction in the figure. Each pillar portion 131 extends vertically in the figure and connects the two circumferential portions 133. In the present embodiment, each of the two dielectric elastomer layers 11A and 11B is separately fixed at its outer edge to one of the circumferential portions 133. In addition, the two dielectric elastomer layers 11A and 11B are fixed to each other at their central portions. Since the two dielectric elastomer layers 11A and 11B are fixed to the support 13 in the manner described above, the dielectric elastomer layers 11A and 11B are stretched into a frustoconical shape, pulling each other upward or downward due to a tensile force.

The power supply device 2 receives a sound signal from the sound source 8 and generates a vibration signal voltage based on the sound signal. The vibration signal voltage is then output to the dielectric elastomer vibrator 1. In the present embodiment, the power supply device 2 includes an input module 20, a waveform-voltage generator 21, a high-voltage generator 24, an inverting-branching module 23 and two output modules 29A and 29B.

The input module 20 receives a sound signal from the sound source 8. The output modules 29A and 29B output vibration signal voltages Va and Vb to the dielectric elastomer vibrator 1. The output modules 29A and 29B may have a booster function.

The waveform-voltage generator 21 generates a waveform voltage V1 from the sound signal that is received from the sound source 8 by the input module 20. The waveform-voltage generator 21 may be composed of an amplifier circuit, for example. The waveform voltage V1 generated by the waveform-voltage generator 21 has an alternating current waveform.

The high-voltage generator 24 generates a high voltage HV2. The high voltage HV2 may be a direct current voltage having a constant magnitude.

The inverting-branching module 23 performs the process of splitting the waveform voltage V1 supplied from the waveform-voltage generator 21 into two waveform voltages V1a and V1b and also performs the inversion process of causing the waveform voltages V1a and V1b to have waveforms mutually opposite in polarity. Consequently, the inverting-branching module 23 outputs two waveform voltages V1a and V1b that are mutually opposite in polarity.

Figure 6:
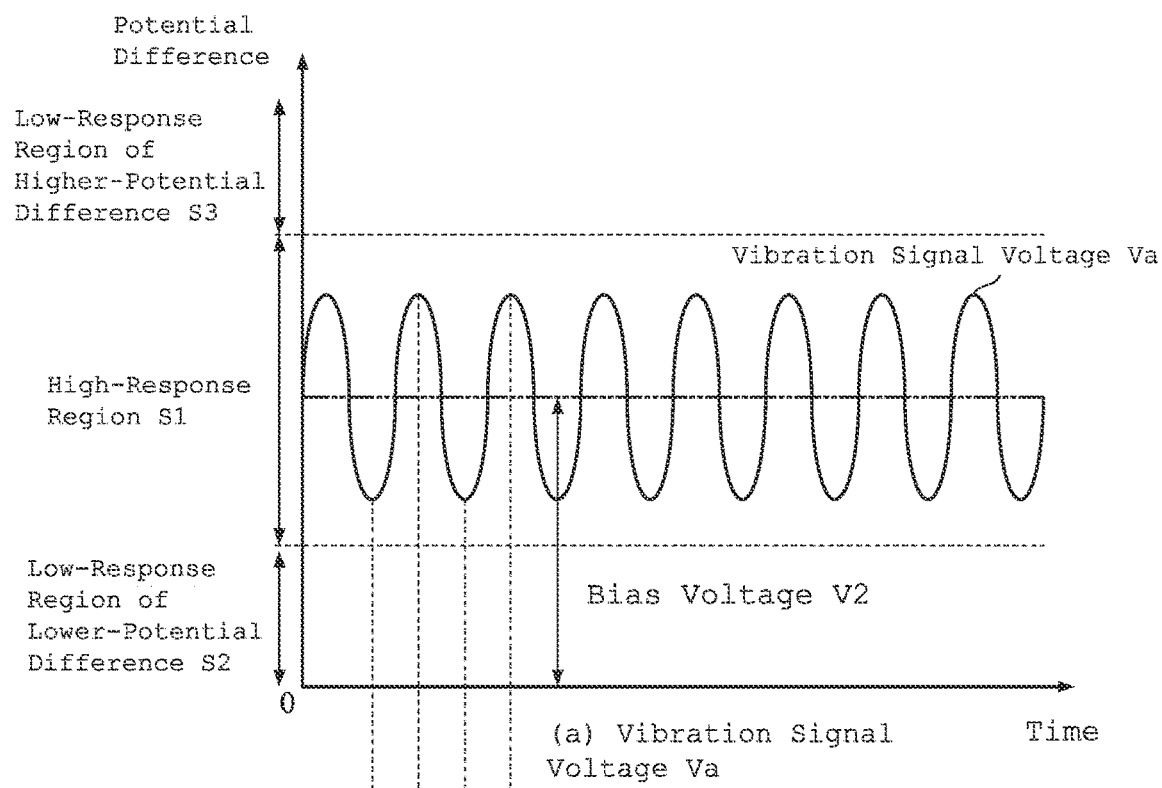
FIG. 6 includes a graph (a) showing an example of a potential difference caused by a vibration signal voltage Va used in the dielectric elastomer vibration system according to the first embodiment of the present disclosure and a graph (b) showing an example of the potential difference caused by the vibration signal voltage Vb used in the dielectric elastomer vibration system according to the first embodiment of the present disclosure.
Figure 6:
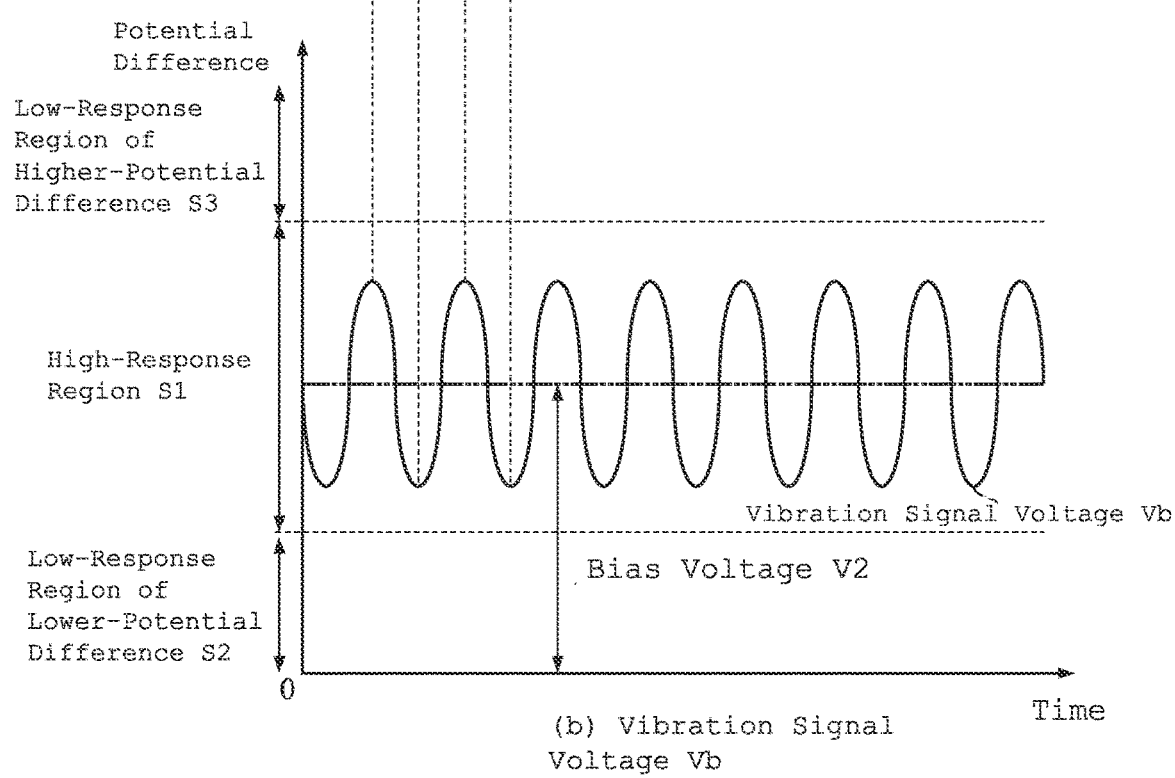

The two output modules 29A and 29B respectively receive the waveform voltages V1a and V1b from the inverting-branching module 23 and also receive the high voltage HV2 from the high-voltage generator 24. Each of the output modules 29A and 29B of this embodiment includes an amplifier circuit. The amplifier circuits generate the vibration signal voltages Va and Vb respectively by amplifying the waveform voltages V1a and V1b using the high voltage HV2 as the source voltage. The output module 29A outputs the vibration signal voltage Va to the pair of electrode layers 12A of the dielectric elastomer vibrator 1, whereas the output module 29B outputs the vibration signal voltage Vb to the pair of electrode layers 12B of the dielectric elastomer vibrator 1. As shown in FIG. 6, this process of outputting the vibration signal voltages Va and Vb is equivalent to outputting the voltages obtained by adding the bias voltage V2 to the waveform voltages V1a and V1b. In the following description, the voltage generation process is described with reference to the bias voltage V2 to illustrate the concept of the process involving operation of the output modules 29A and 29B having amplifier circuits. In one specific implementation of the process of adding the bias voltage V2 to the waveform voltages V1a and V1b, the output modules 29A and 29B may each include a transformer, for example. Note that a system that outputs a voltage obtained by adding the bias voltage V2 can be implemented without a structural component called by a name containing "bias voltage". For example, the present embodiment implements the process of adding the bias voltage V2 by using the high-voltage generator 24 that generates a high voltage HV2.

Figure 4:
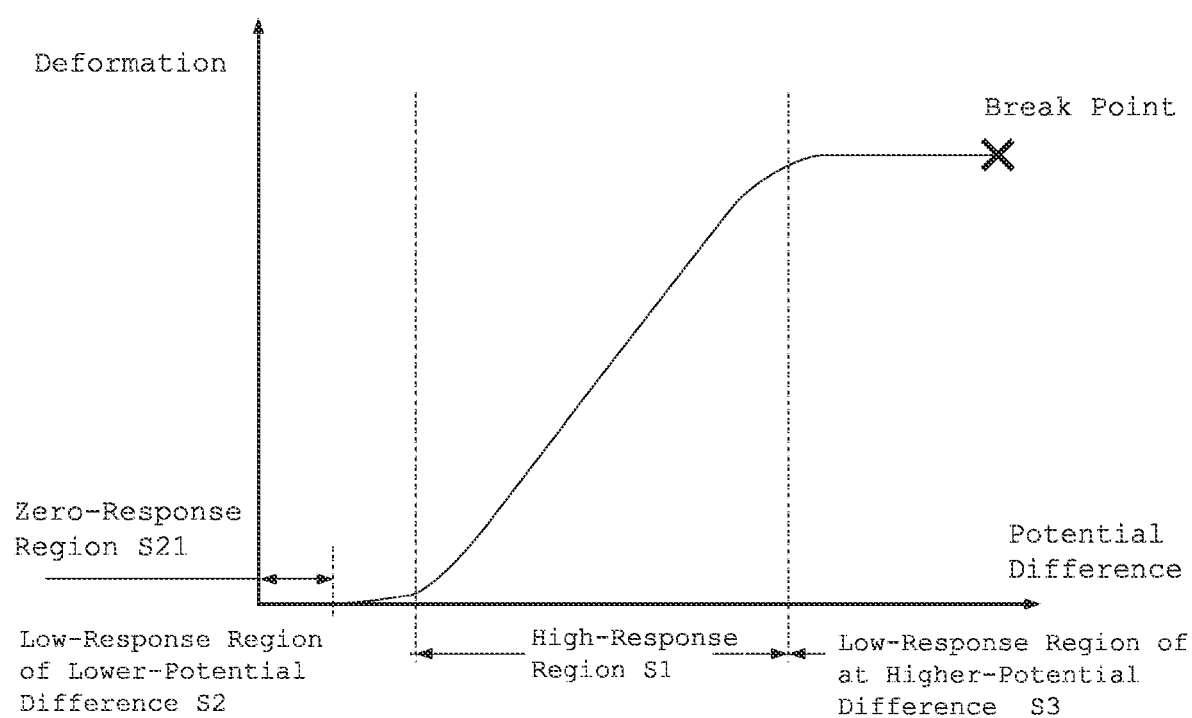
FIG. 4 is a graph showing the relationship between deformation of the dielectric elastomer vibrator and the potential difference.

FIG. 4 shows the relationship between the potential difference across one pair of electrode layers 12 and the amount of deformation, for example in length or area, induced in the dielectric elastomer vibrator 1. As shown in the figure, the relationship exhibited by the dielectric elastomer vibrator 1 has a high-response region S1, a low-response region of lower-potential difference S2 and a low-response region of higher-potential difference S3, each corresponding to the specific magnitudes of the potential difference across the pair of electrode layers 12. In the high-response region S1, a relatively large amount of deformation is induced in response to change of the potential difference. In the low-response region of lower-potential difference S2, the potential difference is lower than the potential difference in the high-response region S1, and a relatively small amount of deformation is induced in response to change of the potential difference. Note that the region in which the amount of deformation is relatively small includes a region in which the deformation in response to change of the potential difference is zero. In the example shown in FIG. 4, the low-response region of lower-potential difference S2 includes a zero-response region S21. The zero-response region S21 is where the amount of deformation in response to change of the potential difference is zero and includes a point at which the potential difference is zero. In the low-response region of lower-potential difference S2 shown in the figure, the region next to the zero-response region S21 at the side of higher potential difference is where the response to the potential difference change is relatively small. In the low-response region of higher-potential difference S3, the potential difference is higher than the potential difference in the high-response region S1 and a relatively small amount of deformation is induced in response to change of the potential difference. The low-response region of higher-potential difference S3 also includes a break point at which an electrical breakdown of the dielectric elastomer layer 11 occurs due to an excessive potential difference.

Figure 5:
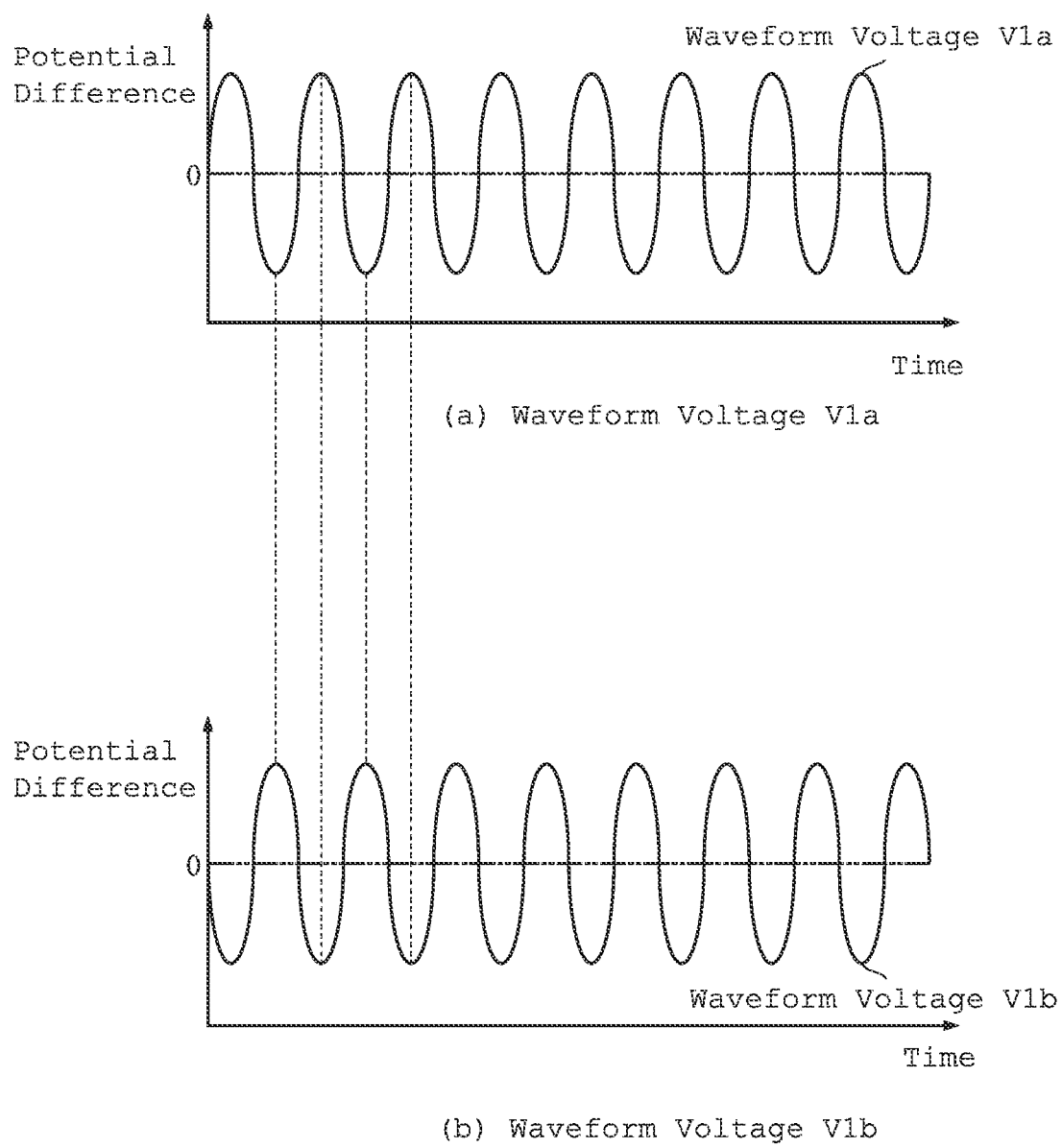
FIG. 5 includes a graph (a) showing an example of a potential difference caused by a waveform voltage V1$a$ used in the dielectric elastomer vibration system according to the first embodiment of the present disclosure, and a graph (b) showing an example of a potential difference caused by the waveform voltage V1$b$ used in the dielectric elastomer vibration system according to the first embodiment.

FIG. 5 shows the waveform voltages V1a and V1b. As shown in the graph (a), the waveform voltage V1a is an alternating current signal based on a sound signal, for example. As shown in the graph (b) and similarly to the waveform voltage V1a, the waveform voltage V1b is an alternating current signal based on a sound signal, for example. The waveform voltage V1a and the waveform voltage V1b are inverted in phase from each other. In other words, the waveform voltage V1a and the waveform voltage V1b have mutually opposites polarities. FIG. 6 shows the potential differences caused by the vibration signal voltages Va and Vb, in relation to the high-response region S1, the low-response region of lower-potential difference S2 and the low-response region of higher-potential difference S3. As shown in the graph (a), the vibration signal voltage Va is obtained by combining (adding) the waveform voltage V1a, which is an alternating current voltage, and the bias voltage V2, which is a direct current voltage. As shown in the graph (b), the vibration signal voltage Vb is obtained by combining (adding) the waveform voltage V1b, which is an alternating current voltage, and the bias voltage V2, which is a direct current voltage. The vibration signal voltage Va and the vibration signal voltage Vb are mutually opposite in phase.

The waveform voltages V1a and V1b are based on the sound signal received from the sound source 8. Each of the waveform voltages V1a and V1b has such a magnitude that the difference between the upper and lower limit voltage values is smaller than the difference between the minimum and maximum potential difference values in the high-response region S1. The bias voltage V2 at least satisfies that the value of the bias voltage V2 falls within the high-response region S1. Preferably, the bias voltage V2 has a value ensuring that the potential difference of the resulting vibration signal voltages Va and Vb will have the maximum and minimum values both falling within the high-response region S1. More preferably, the bias voltage V2 has a potential difference value that is equal to the median value of the potential difference in the high-response region S1. The resulting vibration signal voltages Va and Vb are applied to the dielectric elastomer vibrator 1. More specifically, the vibration signal voltage Va is applied across the pair of the electrode layers 12A, and the vibration signal voltage Vb to the pair of the electrode layers 12B. In this manner, in the dielectric elastomer vibrator 1, the dielectric elastomer layers 11A and 11B and the central portion 132 of the support 13 function like a cone-shaped diaphragm, which is typically made from paper, of a common speaker. When the waveform voltage V1 of about 20 to kHz is input, the dielectric elastomer vibrator 1 outputs sounds in the audible frequency range.

Next, advantages of the dielectric elastomer vibration system A1 will be described.

According to the present embodiment, the potential difference caused by the bias voltage V2 across the pair of electrode layers 12 falls within the high-response region S1. Therefore, the potential differences caused by the vibration signal voltages Va and Vb are more likely to fall in the high-response region S1 and less likely to fall in either of the low-response region of lower-potential difference S2 and the low-response region of higher-potential difference S3. Suppose that the potential difference falls in the low-response region of lower-potential difference S2. In this case, the dielectric elastomer vibrator 1 deforms little in response to the potential difference change as shown in FIG. 4. If the potential difference varies between the low-response region of lower-potential difference S2 and the high-response region S1, the amount of deformation changes non-linearly with the potential difference change. Such examples may result in problems, including distortion of sound. The present embodiment ensures that the potential difference falls within the high-response region S1. Consequently, a relatively large amount of deformation is induced in response to the potential difference change, and the amount of deformation changes more linearly with the potential difference change. The present embodiment can therefore suppress distortion of the sound output. The potential difference falling within the low-response region of higher-potential difference S3 is not preferable either, as it may cause sound distortion or failure of the dielectric elastomer vibrator 1. The present embodiment is configured to avoid such a risk. The dielectric elastomer vibration system A1 is therefore configured to produce sound more appropriately.

In the present embodiment, in addition, the potential differences caused by the vibration signal voltages Va and Vb have the maximum and minimum values both fall within the high-response region S1. This is effective to prevent sound distortion and failure of the dielectric elastomer vibrator 1.

Unlike the present embodiment, suppose that the potential difference caused by the bias voltage V2 is close to the upper or lower limit value of the potential difference corresponding to the high-response region S1. Then, the waveform voltages V1a and V1b are required to have a relatively small amplitude. Otherwise, the potential difference caused by the resulting vibration signal voltages Va and Vb will not fall within the high-response region S1. This leads to narrowing of the dynamic range of sound output by the dielectric elastomer vibration system A1. In the present embodiment, the bias voltage V2 is set to cause the potential difference having a value equal to the median value of the high-response region S1. This setting allows the waveform voltages V1a and V1b to have a sufficiently large amplitude, while ensuring that the potential difference caused by the vibration signal voltages Va and Vb to fall within the high-response region S1. The dielectric elastomer vibration system A1 is thus configured to produce sound with a wider dynamic range.

The potential difference required for the dielectric elastomer layers 11 to vibrate at a certain amplitude is smaller when the potential difference of the vibration signal voltage Va and Vb remains within the high-response region S1 as in the present embodiment than when, unlike the present invention, the potential difference can be in the low-response region of lower-potential difference S2. The present embodiment is therefore more energy saving and highly efficient as it can avoid charging and discharging of unnecessary charges and generate sound with less electric energy. In addition, the present embodiment ensures that the amount of deformation changes linearly with the potential difference. Therefore, the dielectric elastomer vibrator 1 can deform in response to the potential difference change without delay and thus achieves high-speed responsivity.

FIGS. 7 to 14 show other embodiments of the present disclosure. In the figures, elements that are the same as or similar to those of the first embodiment are denoted by the same reference signs, and a description of such an element will not be repeated.

Second Embodiment

Figure 7:
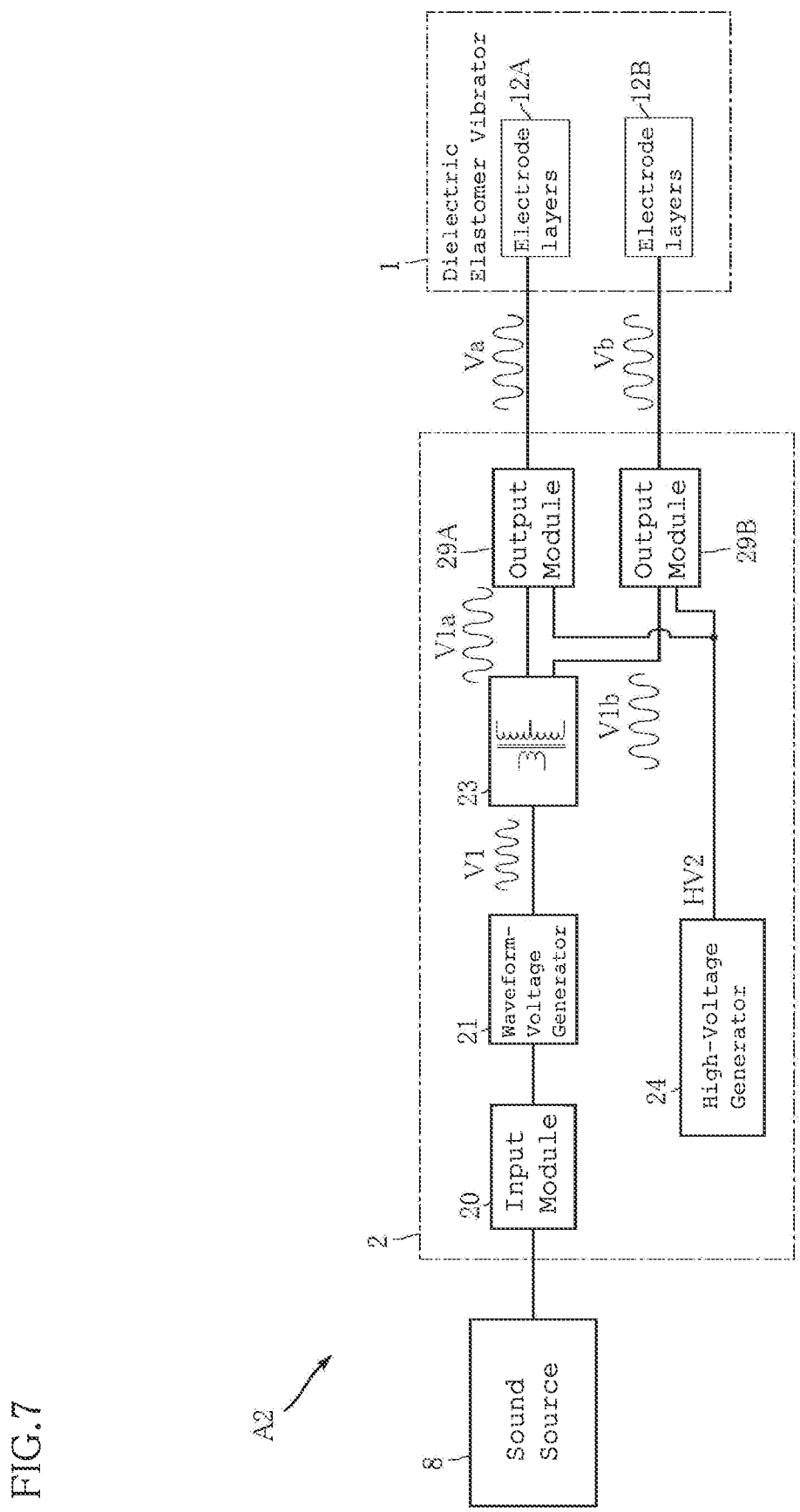
FIG. 7 is a block diagram of a dielectric elastomer vibration system according to a second embodiment of the present disclosure.

FIG. 7 shows a power supply device and a dielectric elastomer vibration system according to a second embodiment of the present disclosure. In the dielectric elastomer vibration system A2 of the present embodiment, the inverting-branching module 23 of the power supply device 2 is composed of a push-pull output transformer. The inverting-branching module 23 includes a primary winding on the input side and two secondary windings on the output side. The two secondary windings on the output side are wound in the mutually opposite directions. Due to this configuration, when the waveform voltage V1, which is an alternating current voltage, is inputted on the input side, the two secondary windings induce waveform voltages V1a and V1b having mutually opposite polarities.

The output modules 29A and 29B may each have a semiconductor transistor to boost (amplify) the respective waveform voltages V1a and V1b. The output modules 29A and 29B receive the high voltage HV2 from the high-voltage generator 24. In the output modules 29A and 29B, the waveform voltages V1a and V1b having been boosted (amplified) are each combined with (added to) the high voltage HV2 serving as a bias voltage. As a result, the output modules 29A and 29B respectively output the vibration signal voltages Va and Vb to the pairs of electrode layers 12A and 12B.

The dielectric elastomer vibration system A2 can therefore produce sound more appropriately. In addition, the use of a push-pull output transformer as the inverting-branching module 23 eliminates the need for a semiconductor device for phase inversion. This configuration contributes to the system cost reduction. In general, a semiconductor device for phase inversion is more expensive if a higher operating voltage is required. The dielectric elastomer vibration system A2 is therefore particularly effective to increase the operating voltage while preventing the cost increase. In addition, the use of a push-pull output transformer can also reduce the number of components constituting the power supply device 2, so that the mean time between failures can be extended and the quality can be improved.

Third Embodiment

Figure 8:
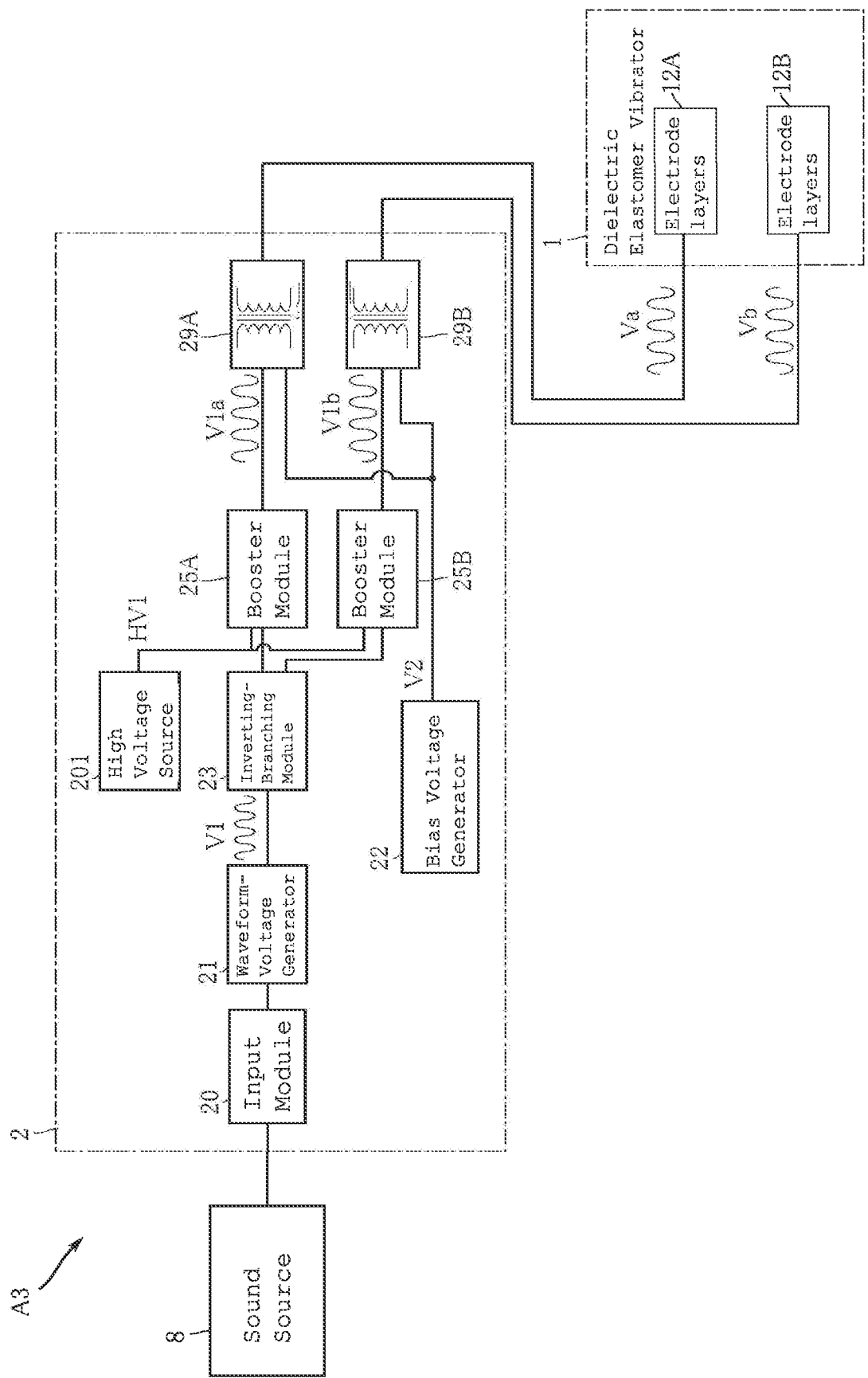
FIG. 8 is a block diagram of a dielectric elastomer vibration system according to a third embodiment of the present disclosure.

FIG. 8 shows a power supply device and a dielectric elastomer vibration system according to a third embodiment of the present disclosure. In the dielectric elastomer vibration system A3 of the present embodiment, the power supply device 2 includes booster modules 25A and 25B. The booster modules 25A and 25B receive the waveform voltages V1a and V1b, which have been inverted and split in the inverting-branching module 23 by using a semiconductor transistor, for example. The booster modules 25A and 25B also receive the high voltage HV1 from the high-voltage source 201. The booster modules 25A and 25B respectively boost (amplify) the waveform voltages V1a and V1b each by using a semiconductor transistor, for example. The output modules 29A and 29B receive the resulting waveform voltages V1a and V1b from the booster modules 25A and 25B and also receive the bias voltage V2 from a bias voltage generator 22. In the output modules 29A and 29B, each of the waveform voltages V1a and V1b is combined with (added to) the bias voltage V2 by using a transformer. The dielectric elastomer vibration system A3 can therefore produce sound more appropriately.

Fourth Embodiment

Figure 9:
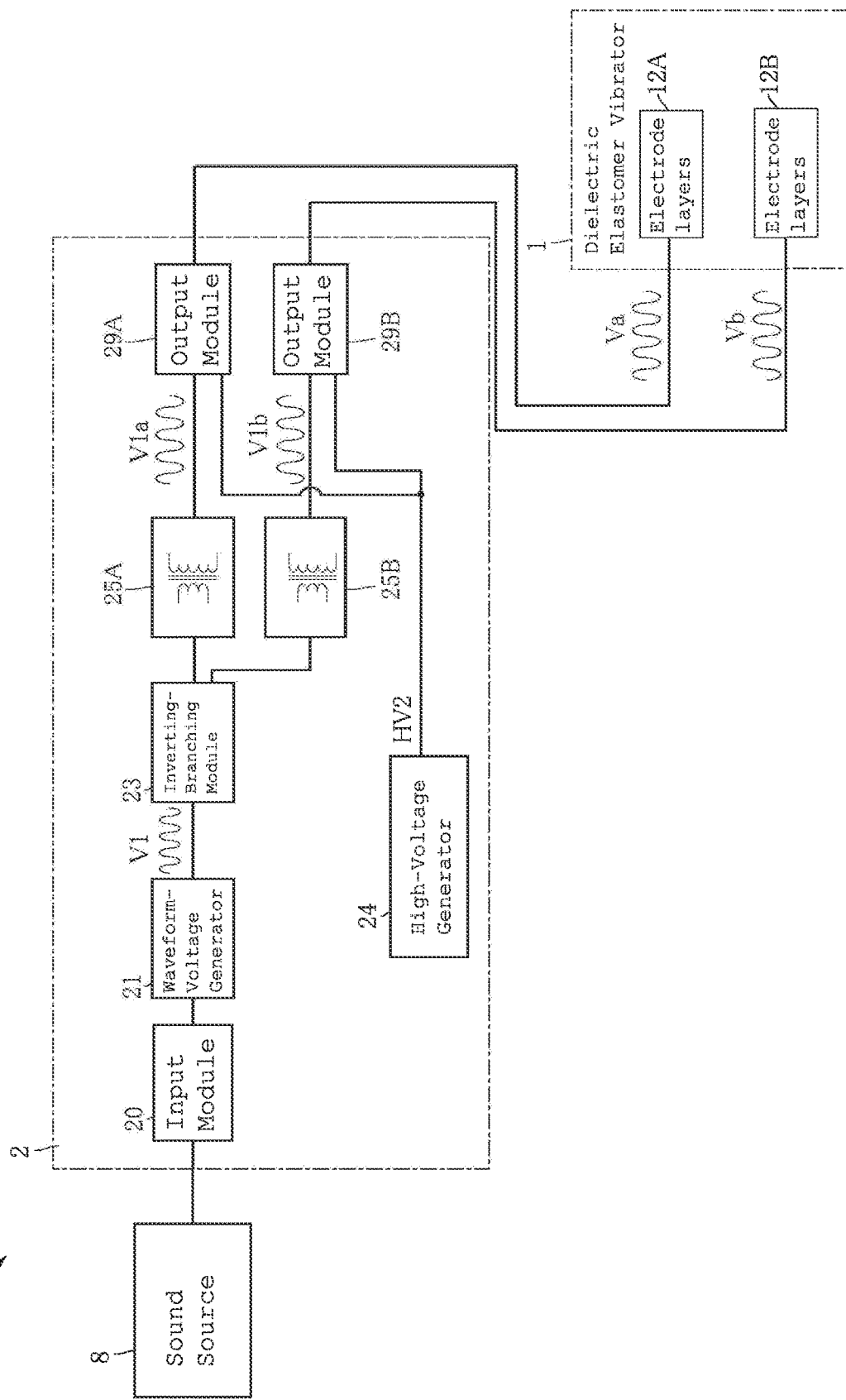
FIG. 9 is a block diagram of a dielectric elastomer vibration system according to a fourth embodiment of the present disclosure.

FIG. 9 shows a power supply device and a dielectric elastomer vibration system according to a fourth embodiment of the present disclosure. The dielectric elastomer vibration system A4 of the present embodiment includes booster modules 25A and 25B each of which includes a transformer. That is, the booster modules 25A and 25B receive the waveform voltages V1a and V1b, which have been inverted and split in the inverting-branching module 23 by using a semiconductor transistor, for example. The booster modules 25A and 25B respectively boost (amplify) the waveform voltages V1a and V1b using their transformers. Each of the output modules 29A and 29B may include a semiconductor transistor, for example. The output modules 29A and 29B combine (amplify) the waveform voltages V1a and V1b with the high voltage HV2, which serves as a bias voltage, received from the high-voltage generator 24. The output modules 29A and 29B then output the resulting voltages as the vibration signal voltages Va and Vb. The dielectric elastomer vibration system A4 can therefore produce sound more appropriately.

Fifth Embodiment

Figure 10:
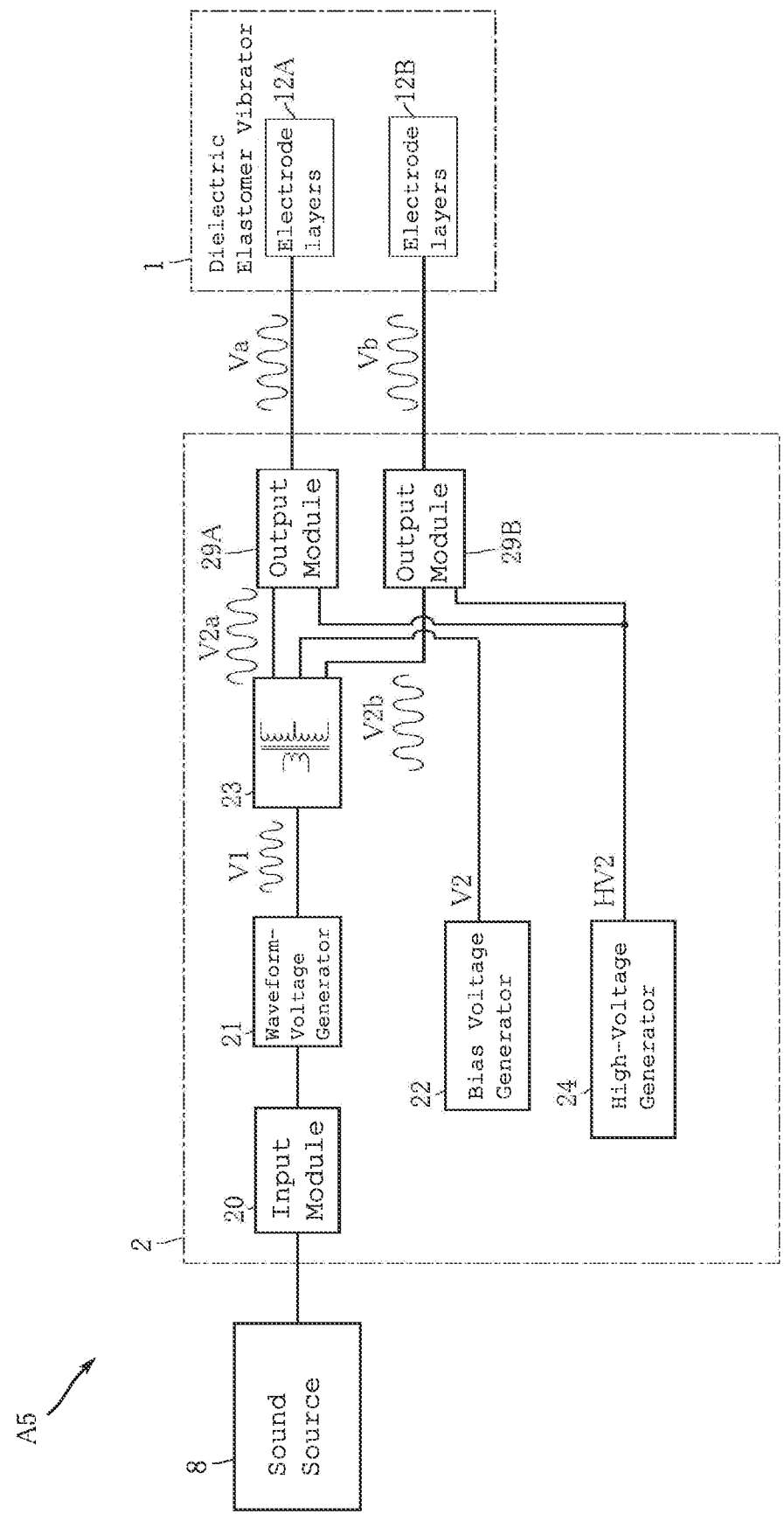
FIG. 10 is a block diagram of a dielectric elastomer vibration system according to a fifth embodiment of the present disclosure.
Figure 11:
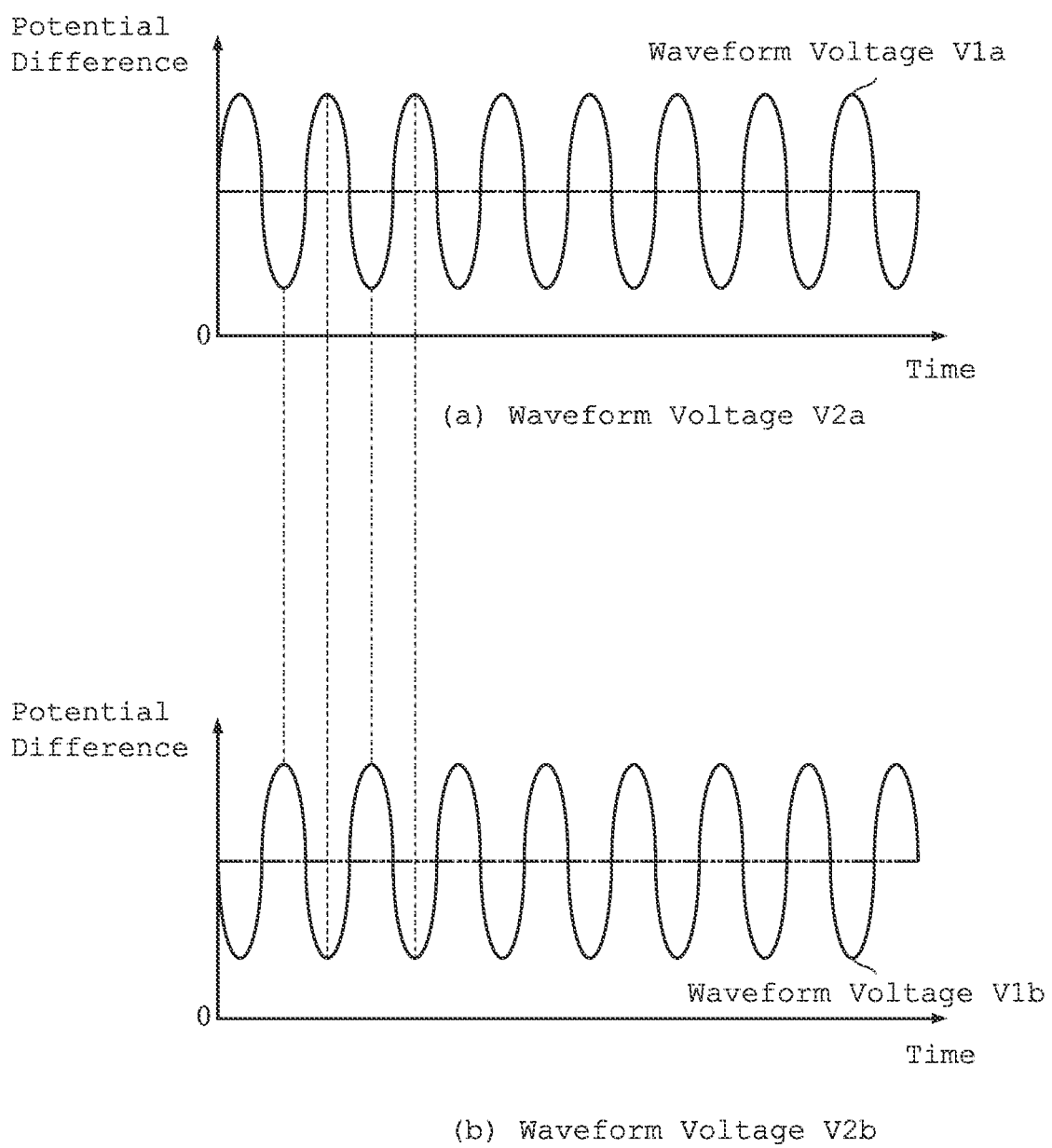
FIG. 11 includes a graph (a) showing an example of a potential difference caused by a waveform voltage V2a used in the dielectric elastomer vibration system according to the fifth embodiment of the present disclosure, and a graph (b) showing an example of a potential difference caused by the waveform voltage V2b used in the dielectric elastomer vibration system according to the fifth embodiment of the present disclosure.

FIG. 10 shows a power supply device and a dielectric elastomer vibration system according to a fifth embodiment of the present disclosure. The dielectric elastomer vibration system A5 of the present embodiment includes the inverting-branching module 23 that includes a push-pull output transformer. The inverting-branching module 23 receives a waveform voltage V1 and also receives a bias voltage V2 from a bias voltage generator 22. In this embodiment, the bias voltage V2 is set to a low voltage. The inverting-branching module 23 inverts and splits the waveform voltage V1, combines (adds) the resulting voltages with the bias voltage V2 to generate the waveform voltages V2a and V2b shown in FIG. 11. The output modules 29A and 29B boost (amplify) the waveform voltages V2a and V2b to output the vibration signal voltages Va and Vb each generated by using a semiconductor transistor to which the high voltage HV2 is inputted from the high-voltage generator 24. The dielectric elastomer vibration system A5 can therefore produce sound more appropriately. In the case where the semiconductor transistor of each of the output modules 29A and 29B boosts the voltage by a factor of 100, the bias voltage V2 is then set to $1/100$ times the ultimate target bias voltage.

Sixth Embodiment

Figure 12:
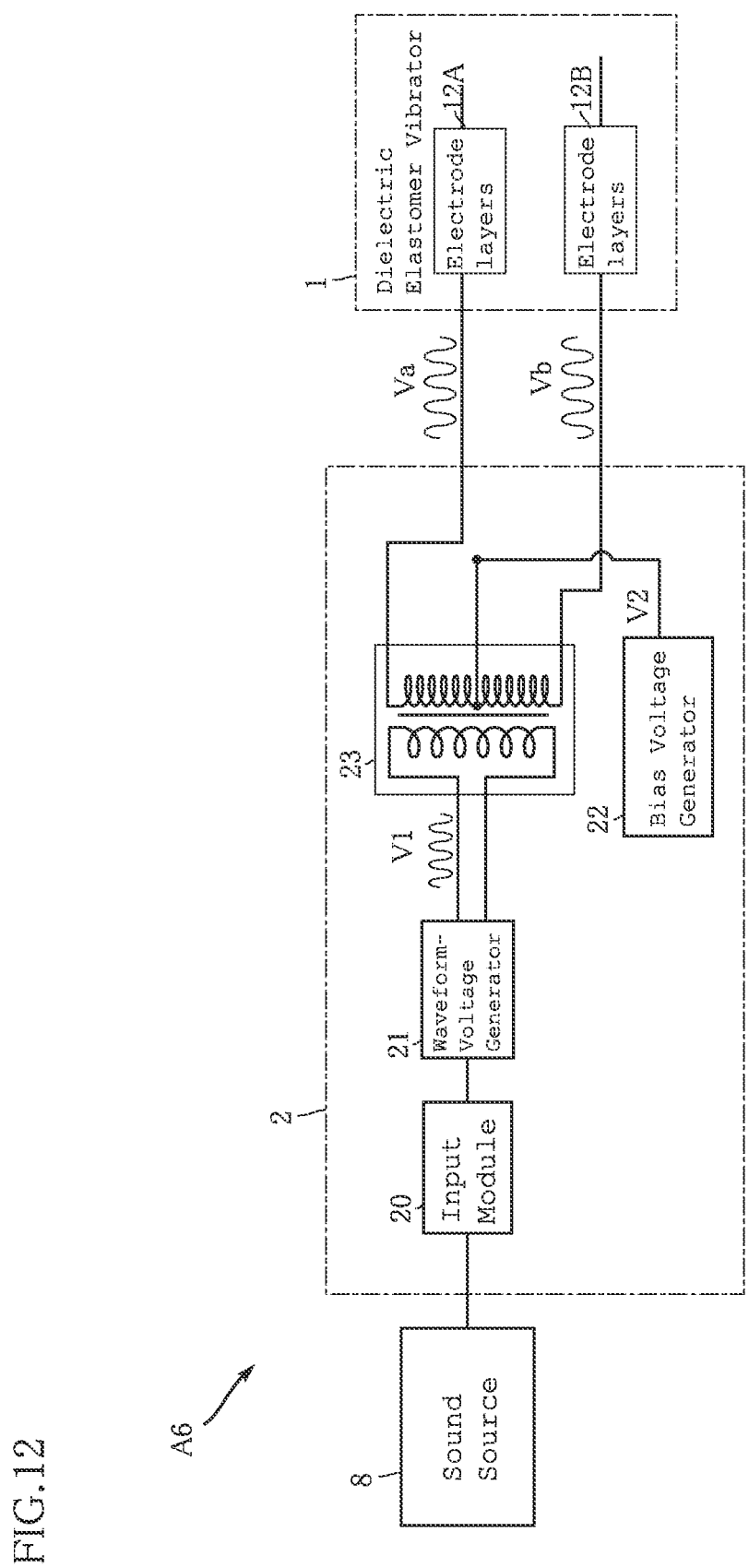
FIG. 12 is a block diagram of a dielectric elastomer vibration system according to a sixth embodiment of the present disclosure.

FIG. 12 shows a power supply device and a dielectric elastomer vibration system according to a sixth embodiment of the present disclosure. In the dielectric elastomer vibration system A6 of the present embodiment, the inverting-branching module 23 includes the two secondary windings having a greater number of turns than the primary winding on the input side. With this configuration, the inverting-branching module 23 can increase the inputted waveform voltage V1 at the ratio of the number of turns on the primary windings to the number of turns on each secondary winding. That is, the inverting-branching module 23 outputs the voltages obtained by combining (adding) the waveform voltages V1a and V1b having been increased (boosted or amplified) at the turns ratio to the bias voltage V2, which is set to a high voltage in this embodiment. That is, the inverting-branching module 23 of this embodiment is configured to perform the inverting and splitting, the bias voltage application and the voltage boosting (amplifying) to output vibration signal voltages Va and Vb. Therefore, the present embodiment does not require the output modules 29A and 29B having a booster function, which is included in the examples described above. This configuration contributes to further reduction of the number of components constituting the power supply device 2, so that the mean time between failures can be extended and the quality can be improved. The dielectric elastomer vibration system A6 can therefore produce sound more appropriately.

Seventh Embodiment

Figure 13:
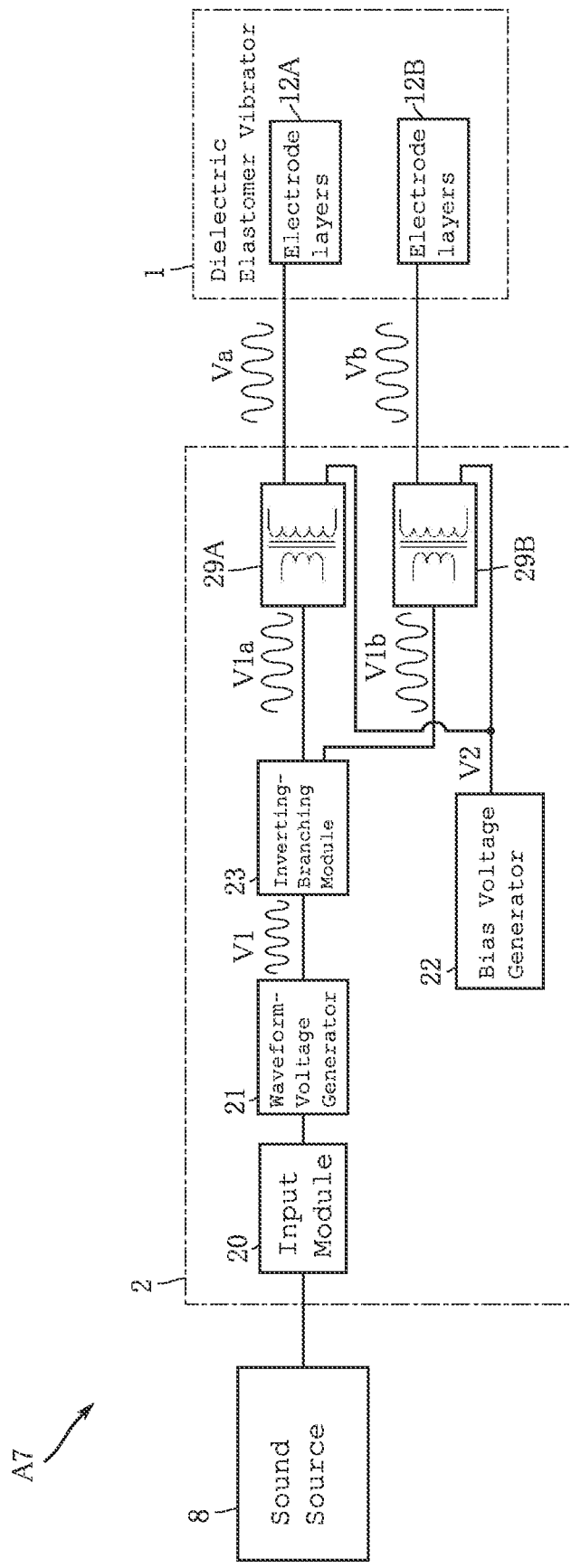
FIG. 13 is a block diagram of a dielectric elastomer vibration system according to a seventh embodiment of the present disclosure.

FIG. 13 shows a power supply device and a dielectric elastomer vibration system according to a seventh embodiment of the present disclosure. The dielectric elastomer vibration system A7 of the present embodiment includes the output modules 29A and 29B each of which includes a transformer. The output modules 29A and 29B receive the waveform voltages V1a and V1b having been inverted and split by the inverting-branching module 23 that includes a semiconductor transistor, for example. The output modules 29A and 29B each having a transformer can boost (amplify) the waveform voltages V1a and V1b and combines the boosted voltages with the high bias voltage V2 received from the bias voltage generator 22. The dielectric elastomer vibration system A7 can therefore to produce sound more appropriately.

Eighth Embodiment

Figure 14:
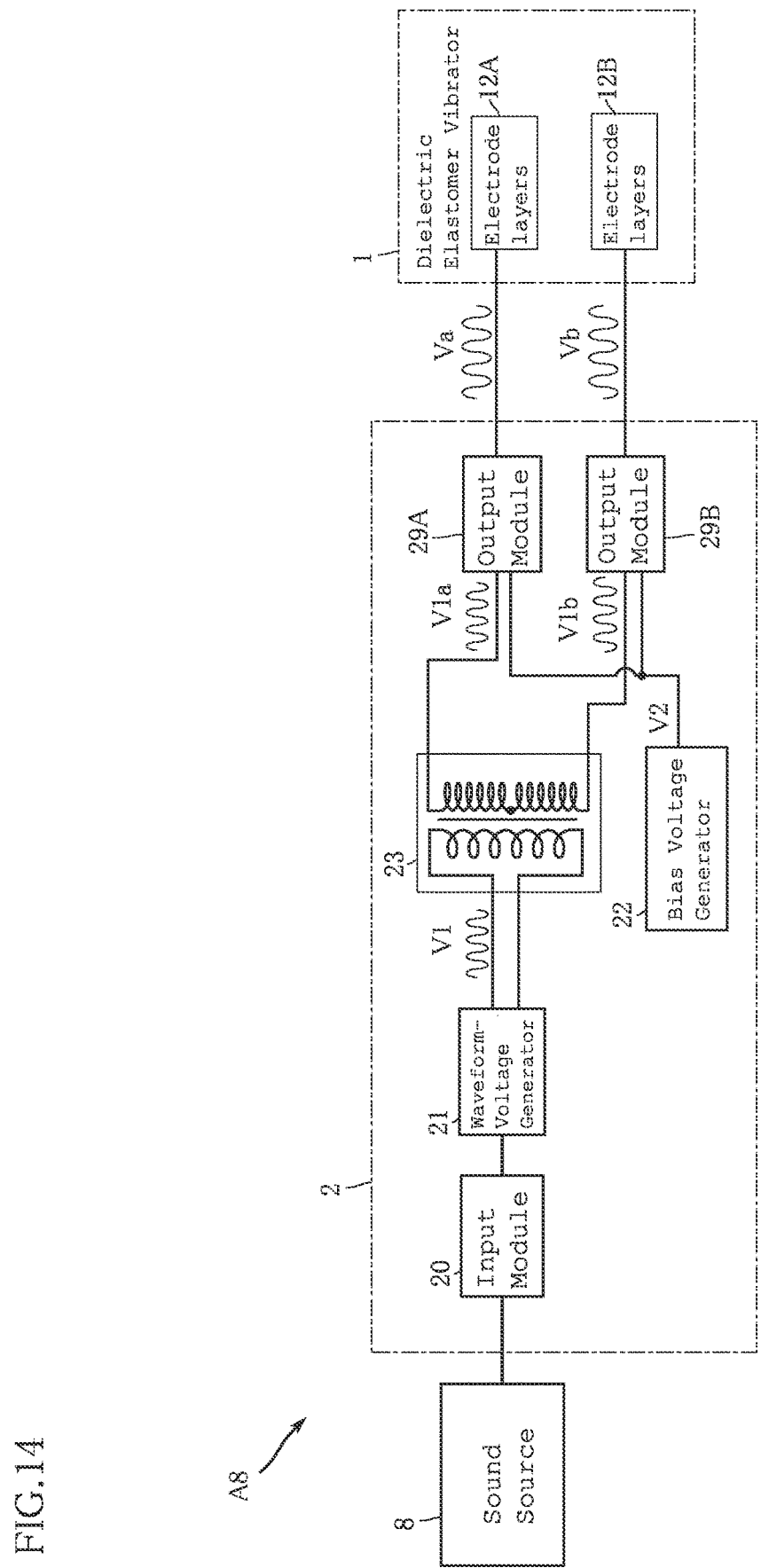
FIG. 14 is a block diagram of a dielectric elastomer vibration system according to an eighth embodiment of the present disclosure.

FIG. 14 shows a power supply device and a dielectric elastomer vibration system according to an eighth embodiment of the present disclosure. In the dielectric elastomer vibration system A8 of the present embodiment, the inverting-branching module 23 includes a push-pull transformer and inverts and split the waveform voltage V1 and boosts (amplify) the resulting voltages to output the waveform voltages V1a and V1b. The output modules 29A and 29B respectively receive the waveform voltages V1a and V1b and also receive the bias voltage V2, which is set to a high voltage in this embodiment. The output modules 29A and 29B combines (added) the received voltages to output the vibration signal voltages Va and Vb. The dielectric elastomer vibration system A8 can therefore produce sound more appropriately.

The dielectric elastomer vibration systems and the power supply devices according to the present disclosure are not limited to the embodiments described above. Various design changes can be made to the specific configurations of the components of the dielectric elastomer vibration systems and the power supply devices of the present disclosure.

Clause 1. A dielectric elastomer vibration system, comprising:
 a dielectric elastomer vibrator that includes a dielectric elastomer layer and a pair of electrode layers sandwiching the dielectric elastomer layer; and
 a power supply device that produces a potential difference across the pair of electrode layers,
 wherein the dielectric elastomer vibrator exhibits a relationship between the potential difference across the pair of electrode layers and an amount of deformation induced by the potential difference, the relationship having:
  a high-response region in which a relatively large deformation is induced in response to change of the potential difference;
  a low-response region of lower-potential difference corresponding to a lower potential difference than the high-response region and in which a relatively small deformation is induced in response to change of the potential difference; and a low-response region of higher-potential difference corresponding to a higher potential difference than the high-response region and in which a relatively small deformation is induced in response to change of the potential difference or in which a break point of the dielectric elastomer layer is included, and the power supply device produces the potential difference by applying a vibration signal voltage across the pair of electrode layers, the vibration signal voltage being generated by combining a waveform voltage that is an alternating current voltage with a bias voltage that is a direct current voltage corresponding to a potential difference falling in the high-response region.

Clause 2. The dielectric elastomer vibration system according to clause 1, wherein the potential difference produced by the vibration signal voltage has a maximum value and a minimum value both falling within the high-response region.

Clause 3. The dielectric elastomer vibration system according to clause 1 or 2, wherein the potential difference produced by the bias voltage corresponds to a median value of the potential difference in the high-response region.

Clause 4. The dielectric elastomer vibration system according to any one of clauses 1 to 3, wherein the power supply device includes a transformer having a booster function.

Clause 5. The dielectric elastomer vibration system according to clause 4, comprising two of the dielectric elastomer vibrators with the respective dielectric elastomer layers fixed to each other in stretched state, wherein the transformer of the power supply device includes a primary winding and two secondary windings, the two secondary windings being wound in mutually opposite directions and inducing, from the one waveform voltage, two waveform voltages having mutually opposite phases, and the power supply device applies two vibration signal voltages having mutually opposite phases separately across the respective pairs of electrode layers of the two dielectric elastomer vibrators.

Clause 6. The dielectric elastomer vibration system according to clause 5, wherein the bias voltage is inputted to a node of the two secondary windings of the transformer.

Clause 7. The dielectric elastomer vibration system according to any one of clauses 1 to 3, comprising two of the dielectric elastomer vibrators with the respective dielectric elastomer layers fixed to each other in stretched state, wherein the power supply device applies two vibration signal voltages having mutually opposite phases separately across the respective pairs of electrode layers of the two dielectric elastomer vibrators.

Clause 8. The dielectric elastomer vibration system according to clause 7, wherein the power supply device includes a transformer that applies the bias voltage.

Clause 9. The dielectric elastomer vibration system according to clause 8, wherein the transformer boosts the waveform voltage.

Clause 10. The dielectric elastomer vibration system according to clause 9, wherein the transformer inverts the waveform voltage in phase.

Clause 11. The dielectric elastomer vibration system according to clause 7, wherein the power supply device includes a transformer that inverts the waveform voltage in phase.

Clause 12. The dielectric elastomer vibration system according to clause 11, wherein the transformer boosts the waveform voltage.

Clause 13. A power supply device for producing a potential difference across a pair of electrode layers sandwiching a dielectric elastomer layer included in a dielectric elastomer vibrator that exhibits a relationship between the potential difference across the pair of electrode layers and an amount of deformation induced by the potential difference, the relationship having:

a high-response region in which a relatively large deformation is induced in response to change of the potential difference;

a low-response region of lower-potential difference corresponding to a lower potential difference than the high-response region and in which a relatively small deformation is induced in response to change of the potential difference; and a low-response region of higher-potential difference corresponding to a higher potential difference than the high-response region and in which a relatively small deformation is induced in response to change of the potential difference or in which a break point of the dielectric elastomer layer is included, wherein the power supply device is configured to produce the potential difference by applying a vibration signal voltage across the pair of electrode layers, the vibration signal voltage being generated by combining a waveform voltage comprising an alternating current voltage with a bias voltage that is a direct current voltage corresponding to a potential difference falling in the high-response region.

Clause 14. The power supply device according to clause 13, comprising a transformer having a booster function.

Clause 15. The power supply device according to clause 14, wherein the transformer includes a primary winding and two secondary windings, the two secondary windings being wound in mutually opposite directions and inducing, from the one waveform voltage, two waveform voltages having mutually opposite phases, and the power supply device outputs two vibration signal voltages having mutually opposite phases separately to two of the dielectric elastomer vibrators that include the respective dielectric elastomer layers fixed to each other in stretched state.

Clause 16. The power supply device according to clause 15, wherein the bias voltage is inputted to a node of the two secondary windings of the transformer.

Clause 17. The power supply device according to clause 13, wherein the power supply device applies two vibration signal voltages having mutually opposite phases separately across two pairs of electrode layers of two of the dielectric elastomer vibrators that include the respective dielectric elastomer layers fixed to each other in stretched state.

Clause 18. The power supply device according to clause 17, comprising a transformer that applies the bias voltage.

Clause 19. The power supply device according to clause 18, wherein the transformer boosts the waveform voltage.

Clause 20. The power supply device according to clause 19, wherein the transformer inverts the waveform voltage in phase.

Clause 21. The power supply device according to clause 17, comprising a transformer that inverts the waveform voltage in phase.

Clause 22. The power supply device according to clause 21, wherein the transformer boosts the waveform voltage.

The invention claimed is:

1. A dielectric elastomer vibration system, comprising:
a dielectric elastomer vibrator that includes a dielectric elastomer layer and a pair of electrode layers sandwiching the dielectric elastomer layer; and
a power supply device that produces a potential difference across the pair of electrode layers,
wherein the dielectric elastomer vibrator exhibits a relationship between the potential difference across the pair of electrode layers and an amount of deformation induced by the potential difference, the relationship having: a high-response region in which a relatively large deformation is induced in response to change of the potential difference; a low-response region of lower-potential difference corresponding to a lower potential difference than the high-response region and in which a relatively small deformation is induced in response to change of the potential difference; and a low-response region of higher-potential difference corresponding to a higher potential difference than the high-response region and in which a relatively small deformation is induced in response to change of the potential difference or in which a break point of the dielectric elastomer layer is included, and
the power supply device produces the potential difference by applying a vibration signal voltage across the pair of electrode layers, the vibration signal voltage being generated by combining an alternating waveform voltage with a direct current bias voltage corresponding to a potential difference falling in the high-response region, and
the potential difference produced by the vibration signal voltage has a maximum value and a minimum value both falling within the high-response region.

2. The dielectric elastomer vibration system according to claim 1, wherein the potential difference produced by the bias voltage corresponds to a median value of the potential difference in the high-response region.

3. The dielectric elastomer vibration system according to claim 1, wherein the power supply device includes a transformer having a booster function.

4. The dielectric elastomer vibration system according to claim 3, comprising two dielectric elastomer vibrators with respective dielectric elastomer layers fixed in stretched state,
wherein the transformer of the power supply device includes a primary winding and two secondary windings, the two secondary windings being wound in mutually opposite directions and configured to produce, from the waveform voltage, two waveform voltages of mutually opposite phases, and
the power supply device applies two vibration signal voltages of mutually opposite phases separately across the respective pairs of electrode layers of the two dielectric elastomer vibrators.

5. The dielectric elastomer vibration system according to claim 4, wherein the bias voltage is inputted to a node of the two secondary windings of the transformer.

6. The dielectric elastomer vibration system according to claim 1, comprising two of the dielectric elastomer vibrators with the respective dielectric elastomer layers fixed to each other in stretched state,
wherein the power supply device applies two vibration signal voltages having mutually opposite phases separately across the respective pairs of electrode layers of the two dielectric elastomer vibrators.

7. The dielectric elastomer vibration system according to claim 6, wherein the power supply device includes a transformer that applies the bias voltage.

8. The dielectric elastomer vibration system according to claim 7, wherein the transformer boosts the waveform voltage.

9. The dielectric elastomer vibration system according to claim 8, wherein the transformer inverts the waveform voltage in phase.

10. The dielectric elastomer vibration system according to claim 6, wherein the power supply device includes a transformer that inverts the waveform voltage in phase.

11. The dielectric elastomer vibration system according to claim 10, wherein the transformer boosts the waveform voltage.

12. A power supply device for producing a potential difference across a pair of electrode layers sandwiching a dielectric elastomer layer included in a dielectric elastomer vibrator that exhibits a relationship between the potential difference across the pair of electrode layers and an amount of deformation induced by the potential difference, the relationship having:
a high-response region in which a relatively large deformation is induced in response to change of the potential difference;
a low-response region of lower-potential difference corresponding to a lower potential difference than the high-response region and in which a relatively small deformation is induced in response to change of the potential difference; and
a low-response region of higher-potential difference corresponding to a higher potential difference than the high-response region and in which a relatively small deformation is induced in response to change of the potential difference or in which a break point of the dielectric elastomer layer is included,
wherein the power supply device is configured to produce the potential difference by applying a vibration signal voltage across the pair of electrode layers, the vibration signal voltage being generated by combining a waveform voltage comprising an alternating current voltage with a bias voltage that is a direct current voltage corresponding to a potential difference falling in the high-response region.

13. The power supply device according to claim 12, comprising a transformer having a booster function.

14. The power supply device according to claim 13,
wherein the transformer includes a primary winding and two secondary windings, the two secondary windings being wound in mutually opposite directions and inducing, from the one waveform voltage, two waveform voltages having mutually opposite phases, and
the power supply device outputs two vibration signal voltages having mutually opposite phases separately to two of the dielectric elastomer vibrators that include the respective dielectric elastomer layers fixed to each other in stretched state.

15. The power supply device according to claim 14, wherein the bias voltage is inputted to a node of the two secondary windings of the transformer.

16. The power supply device according to claim 12, wherein the power supply device applies two vibration signal voltages having mutually opposite phases separately across two pairs of electrode layers of two of the dielectric elastomer vibrators that include the respective dielectric elastomer layers fixed to each other in stretched state.

17. The power supply device according to claim 16, comprising a transformer that applies the bias voltage.

18. The power supply device according to claim 17, wherein the transformer boosts the waveform voltage.

19. The power supply device according to claim 18, wherein the transformer inverts the waveform voltage in phase.

20. The power supply device according to claim 16, comprising a transformer that inverts the waveform voltage in phase.

21. The power supply device according to claim 20, wherein the transformer boosts the waveform voltage.

* * * * *